(12) United States Patent
Ueda

(10) Patent No.: US 12,140,614 B2
(45) Date of Patent: Nov. 12, 2024

(54) ENERGY STORAGE APPARATUS AND METHOD FOR CHECKING FUNCTION OF ENERGY STORAGE APPARATUS

(71) Applicant: GS Yuasa International Ltd., Kyoto (JP)

(72) Inventor: Yuki Ueda, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 184 days.

(21) Appl. No.: 17/802,095

(22) PCT Filed: Mar. 10, 2021

(86) PCT No.: PCT/JP2021/009599
§ 371 (c)(1),
(2) Date: Aug. 24, 2022

(87) PCT Pub. No.: WO2021/193070
PCT Pub. Date: Sep. 30, 2021

(65) Prior Publication Data
US 2023/0083169 A1     Mar. 16, 2023

(30) Foreign Application Priority Data
Mar. 24, 2020   (JP) ................................ 2020-052951

(51) Int. Cl.
*G01R 19/165* (2006.01)
*H01M 10/48* (2006.01)

(52) U.S. Cl.
CPC ...... *G01R 19/16542* (2013.01); *H01M 10/48* (2013.01)

(58) Field of Classification Search
CPC .......................... G01R 19/16542; H01M 10/48
See application file for complete search history.

(56) References Cited

U.S. PATENT DOCUMENTS

2004/0018419 A1   1/2004  Sugimoto et al.
2014/0159670 A1*  6/2014  Lee ...................... B60L 3/0007
                                                    320/128

(Continued)

FOREIGN PATENT DOCUMENTS

JP    H07-294579 A    11/1995
JP    H11-150873 A     6/1999
(Continued)

OTHER PUBLICATIONS

International Search Report and Written Opinion for International Application No. PCT/JP2021/009599, dated May 18, 2021, (9 pages), Japan Patent Office, Tokyo, Japan.

*Primary Examiner* — Stephanie E Bloss
*Assistant Examiner* — Michael A Harrison
(74) *Attorney, Agent, or Firm* — Alston & Bird LLP

(57) ABSTRACT

An energy storage apparatus 20 includes: energy storage devices B1 to B4; a cutoff switch 40 that cuts off current of the energy storage device; a parallel circuit 70 including a rectifier element 75 in which a discharge direction is set to a forward direction, the parallel circuit 70 being connected in parallel to the cutoff switch 40; a first current sensor 50 that measures the current of the energy storage devices B1 to B4; a discharge circuit 90 that discharges an inspection current to the first current sensor 50 through a discharge path including the parallel circuit 70 using the energy storage device as a power source; and a controller 80. The controller 80 determines whether the first current sensor 50 correctly measures the current based on a measurement value of the inspection current Ib.

17 Claims, 10 Drawing Sheets

(56) References Cited

U.S. PATENT DOCUMENTS

| | | | | |
|---|---|---|---|---|
| 2015/0214753 A1* | 7/2015 | Shenoy | ............... | H02J 7/0016 |
| | | | | 320/134 |
| 2018/0024196 A1 | 1/2018 | Imura et al. | | |
| 2019/0271743 A1 | 9/2019 | Imura et al. | | |
| 2020/0379050 A1* | 12/2020 | Imanaka | ............... | H02J 7/0047 |
| 2020/0400749 A1 | 12/2020 | Imanaka | | |

FOREIGN PATENT DOCUMENTS

| | | |
|---|---|---|
| JP | 2004-056978 A | 2/2004 |
| JP | 2006-352949 A | 12/2006 |
| JP | 2019-100878 A | 6/2019 |
| JP | 2019-158446 A | 9/2019 |
| WO | WO-2016/103721 A1 | 6/2016 |
| WO | WO-2019111878 A1 * 6/2019 ......... G01R 19/0092 |

\* cited by examiner

Fig. 10

| Measurement error | Discharge in first discharge path | | Discharge in second discharge path | | Determination | Notes |
|---|---|---|---|---|---|---|
| | First current sensor | Second current sensor | First current sensor | Second current sensor | | |
| 0mA | 0mA | 50mA | −50mA | 50mA | ○ | Charge current and load current cancel out each other by load |
| −10mA | −10mA | 40mA | −60mA | 40mA | ○ | Difference in current value is within measurement accuracy error |
| +10mA | 10mA | 60mA | −40mA | 60mA | ○ | Difference in current value is within measurement accuracy error |
| −20mA | −20mA | 30mA | −70mA | 30mA | × | Difference in current value is greater than or equal to measurement accuracy error |
| +20mA | 20mA | 70mA | −30mA | 70mA | × | Difference in current value is greater than or equal to measurement accuracy error |

ENERGY STORAGE APPARATUS AND METHOD FOR CHECKING FUNCTION OF ENERGY STORAGE APPARATUS

CROSS REFERENCE TO RELATED APPLICATIONS

This application is a national stage application, filed under 35 U.S.C. § 371, of International Application No. PCT/JP2021/009599, filed Mar. 10, 2021, which claims priority to Japanese Application No. 2020-052951, filed Mar. 24, 2020, the contents of both of which as are hereby incorporated by reference in their entirety.

BACKGROUND

Technical Field

The present invention relates to an energy storage apparatus.

Description of Related Art

A battery described in Patent Document 1 has a parallel circuit in parallel with a cutoff switch so as not to cause power failure (power cutoff to a load), and can maintain power supply to the load through the parallel circuit even when the cutoff switch is open to cut off current.

In the battery of Patent Document JP-A-2019-100878, an offset error is measured while the power supply to the load is maintained, by using the phenomenon that a capacitor of a vehicle discharges when the cutoff switch is open to cut off the current so that the current of an energy storage apparatus becomes zero. The offset error is an error in which a measurement value of a current sensor indicates a numerical value other than zero even when a true value is zero.

BRIEF SUMMARY

According to one aspect of the present invention, whether the current is correctly measured by the current sensor is determined in the energy storage apparatus that includes a parallel circuit in parallel with the cutoff switch.

An energy storage apparatus according to one aspect of the present invention includes: an energy storage device; a cutoff switch that cuts off a current of the energy storage device; a parallel circuit including a rectifier element in which a discharge direction is set to a forward direction, the parallel circuit being connected in parallel to the cutoff switch; a first current sensor that measures a current of the energy storage device; a discharge circuit that discharges an inspection current to the first current sensor in a discharge path including the parallel circuit using the energy storage device as a power source; and a controller. The controller determines whether or not the first current sensor correctly measures a current based on a measurement value of the inspection current.

The above technique can be applied to a method for checking a function of the energy storage apparatus.

In this configuration, whether the current is correctly measured by the first current sensor can be determined in the energy storage apparatus that includes the parallel circuit in parallel with the cutoff switch.

BRIEF DESCRIPTION OF THE FIGURES

FIG. 10 is a table illustrating a determination result.

DETAILED DESCRIPTION OF VARIOUS EMBODIMENTS

Figure 1:
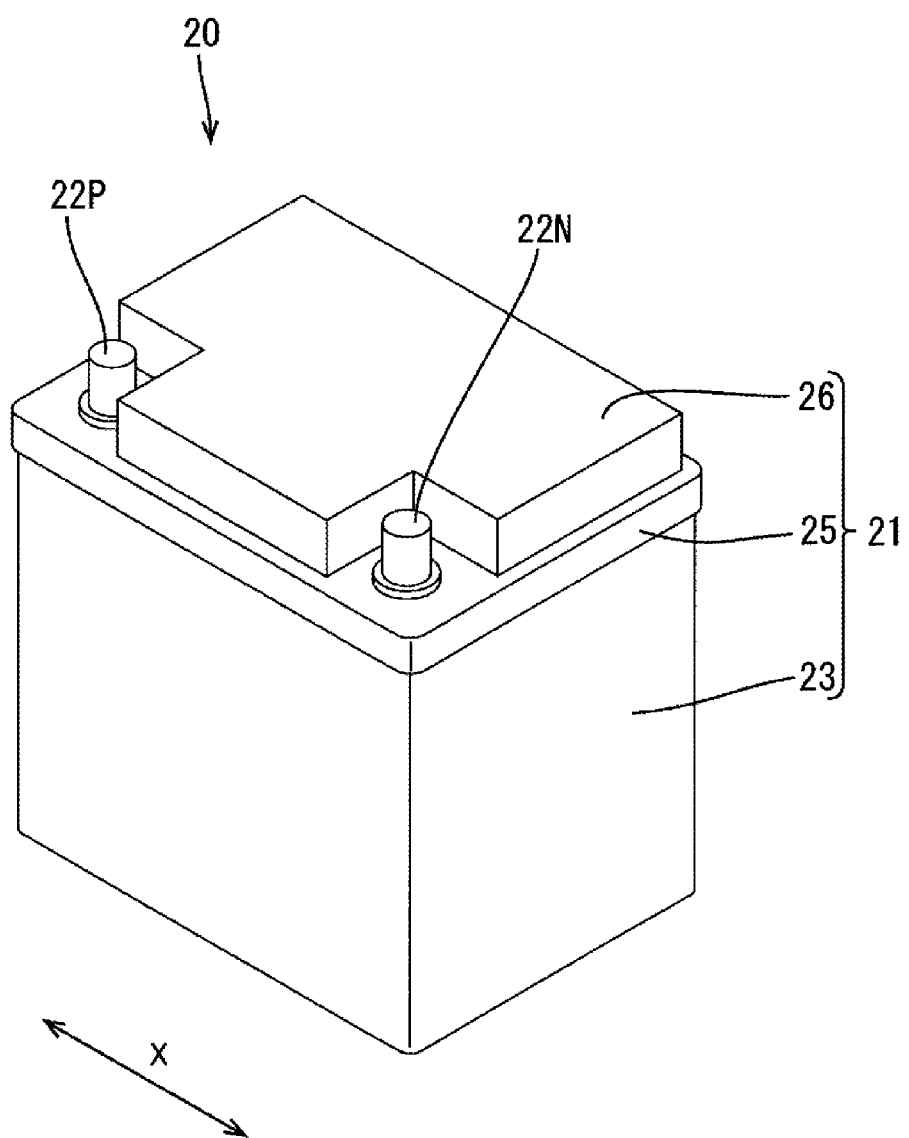
FIG. 1 is a perspective view of a battery.

An outline of an energy storage apparatus will be described.

An energy storage apparatus includes: an energy storage device; a cutoff switch that cuts off current of the energy storage device; a parallel circuit including a rectifier element in which a discharge direction is set to a forward direction, the parallel circuit being connected in parallel to the cutoff switch; a first current sensor that measures the current of the energy storage device; a discharge circuit that discharges an inspection current to the first current sensor through a discharge path including the parallel circuit using the energy storage device as a power source; and a controller. The controller determines whether the first current sensor correctly measures the current based on a measurement value of the inspection current.

It is generally conceivable that the operation of the first current sensor is checked in the state where the cutoff switch is open to cut off the current from the outside during the non-current period of the energy storage apparatus connected to a load, for example. The non-current period is a period in which no current flows in and out from the outside through the external terminal, or a period in which it can be considered that substantially no current flows in and out when the current is less than or equal to a predetermined value.

Alternatively, the operation of the first current sensor may be checked in the state where the energy storage apparatus is not connected to the load. For example, the inspection current may be discharged at timing when a management system of the energy storage apparatus is periodically activated from a sleep mode.

In the above-mentioned configuration, the inspection current flows from the energy storage device to the discharge path including the parallel circuit using the discharge circuit. By measuring the inspection current using the first current sensor, it can be determined whether the current is correctly measured. That is, whether the first current sensor is normal can be checked.

The discharge circuit may include a switching circuit that switches a current path of the inspection current between a first discharge path that does not pass through the first current sensor and a second discharge path that passes through the first current sensor.

In this configuration, the inspection current does not pass through the first current sensor when the first discharge path is selected, and the inspection current passes through the first current sensor when the second discharge path is selected. That is, by switching the discharge path, the measurement values of two patterns, i.e., the case where the inspection current flows through the first current sensor and the case where the inspection current does not flow through the first current sensor, can be obtained. Whether the inspection current is correctly measured can be accurately determined using the measurement values of the two patterns as determination materials.

The controller may select the second discharge path to cause the inspection current to flow, and may determine that the first current sensor correctly measures the current when a measurement value of the first current sensor is matched with the inspection current. In this configuration, the measurement value is matched with the inspection current, and therefore the current measurement by the first current sensor is determined to be correct.

The controller may determine that the first current sensor correctly measures the current when a difference between a measurement value of the first current sensor when the second discharge path is selected as the current path of the inspection current and a measurement value of the first current sensor when the first discharge path is selected is matched with the inspection current. In this configuration, a current change amount in the second current path due to the switching of the discharge path is matched with a change amount of the measurement value of the first current sensor, and therefore, the measurement value of the first current sensor can be determined to be correct.

The controller may determine that the first current sensor correctly measures the current when a measurement value of the first current sensor is matched with the inspection current that flows through the second discharge path, and when a difference between a measurement value of the first current sensor when the second discharge path is selected as the current path of the inspection current and a measurement value of the first current sensor when the first discharge path is selected is matched with the inspection current. In this configuration, the quality of the current measurement is determined from two viewpoints of whether the measurement value is matched with the inspection current and whether the current change amount accompanying the switching of the discharge path is accurately measured. Accordingly, whether the measurement value of the first current sensor is correct can be accurately determined as compared with the case of the determination only from any one viewpoint.

The discharge circuit may include a second current sensor that measures the inspection current. In this configuration, the measurement value of the first current sensor can be compared with the actual measurement value of the inspection current, so that the difference between the two current values can be accurately detected.

The controller may measure an offset error of the first current sensor, and the controller may determine that a measurement value of the offset error is valid when determining that the first current sensor correctly measures the current from the measurement value of the inspection current. In this configuration, validity of the measurement value of the offset error can be determined.

The controller may perform correction processing for correcting the offset error of the first current sensor when determining that the measurement value of the offset error is valid. In this configuration, the offset error is corrected only when the validity can be checked. Thus, the correction can be performed with high accuracy as compared with the case of performing the correction without checking the validity.

First Embodiment

1. Description of Battery

As illustrated in FIG. 1, a battery 20 includes a block-shaped battery case 21, and an assembled battery 30 including a plurality of secondary battery cells B1 to B4 and a circuit board (management system) 28 are accommodated in the battery case 21. The battery 20 is an energy storage apparatus.

Figure 2:
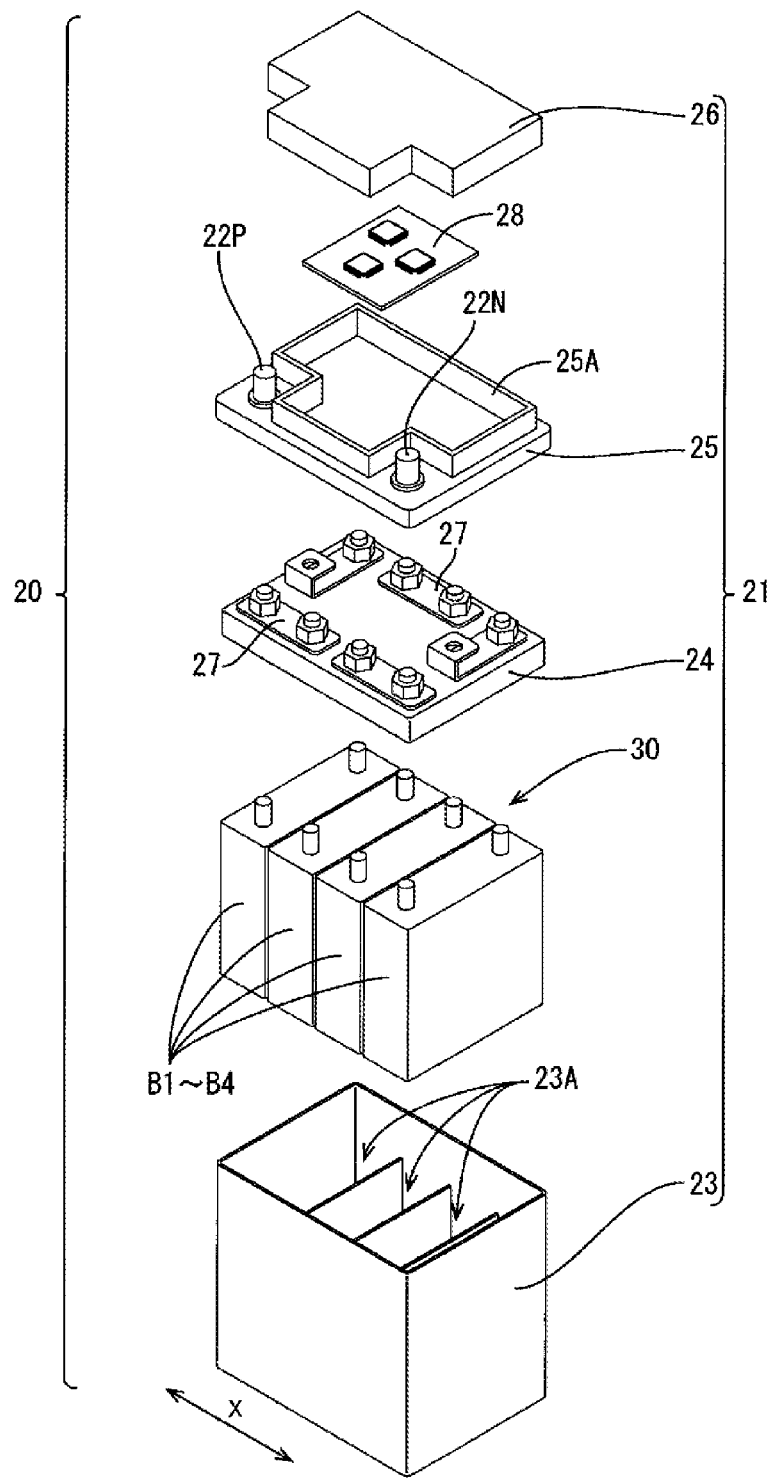
FIG. 2 is an exploded perspective view of the battery.

As illustrated in FIG. 2, the battery case 21 includes a box-shaped case body 23 that is opened upward, a positioning member 24 that positions the plurality of secondary battery cells B1 to B4, an inner lid 25 attached to an upper portion of the case body 23, and an upper lid 26. In the case body 23, as illustrated in FIG. 2, a plurality of cell chambers 23A in each of which the secondary battery cells B1 to B4 is individually accommodated are arranged side by side in an X-direction.

As illustrated in FIG. 2, a plurality of bus bars 27 are disposed on the top surface of the positioning member 24, and the positioning member 24 is disposed on the tops of the plurality of secondary battery cells B1 to B4 disposed in the case body 23, whereby the plurality of secondary battery cells B1 to B4 are positioned and connected in series by the plurality of bus bars 27.

As illustrated in FIG. 1, the inner lid 25 has a substantially rectangular shape in planar view. A pair of external terminals 22P, 22N is provided at both ends in the X-direction of the inner lid 25. The pair of external terminals 22P, 22N is made of, for example, a metal such as a lead alloy, and 22P is an external terminal of a positive electrode and 22N is an external terminal of a negative electrode. The pair of external terminals 22P, 22N is a terminal connecting a load 10 or a charger to the battery 20.

An accommodating unit 25A is provided on an upper surface of the inner lid 25. A circuit board 28 is accommodated in the accommodating unit 25A of the inner lid 25, and the secondary battery cells B and the circuit board 28 are connected to each other by attaching the inner lid 25 to the case body 23. The upper lid 26 is attached to the upper portion of the inner lid 25, and closes the upper surface of the accommodating unit 25A that accommodates the circuit board 28.

Figure 3:
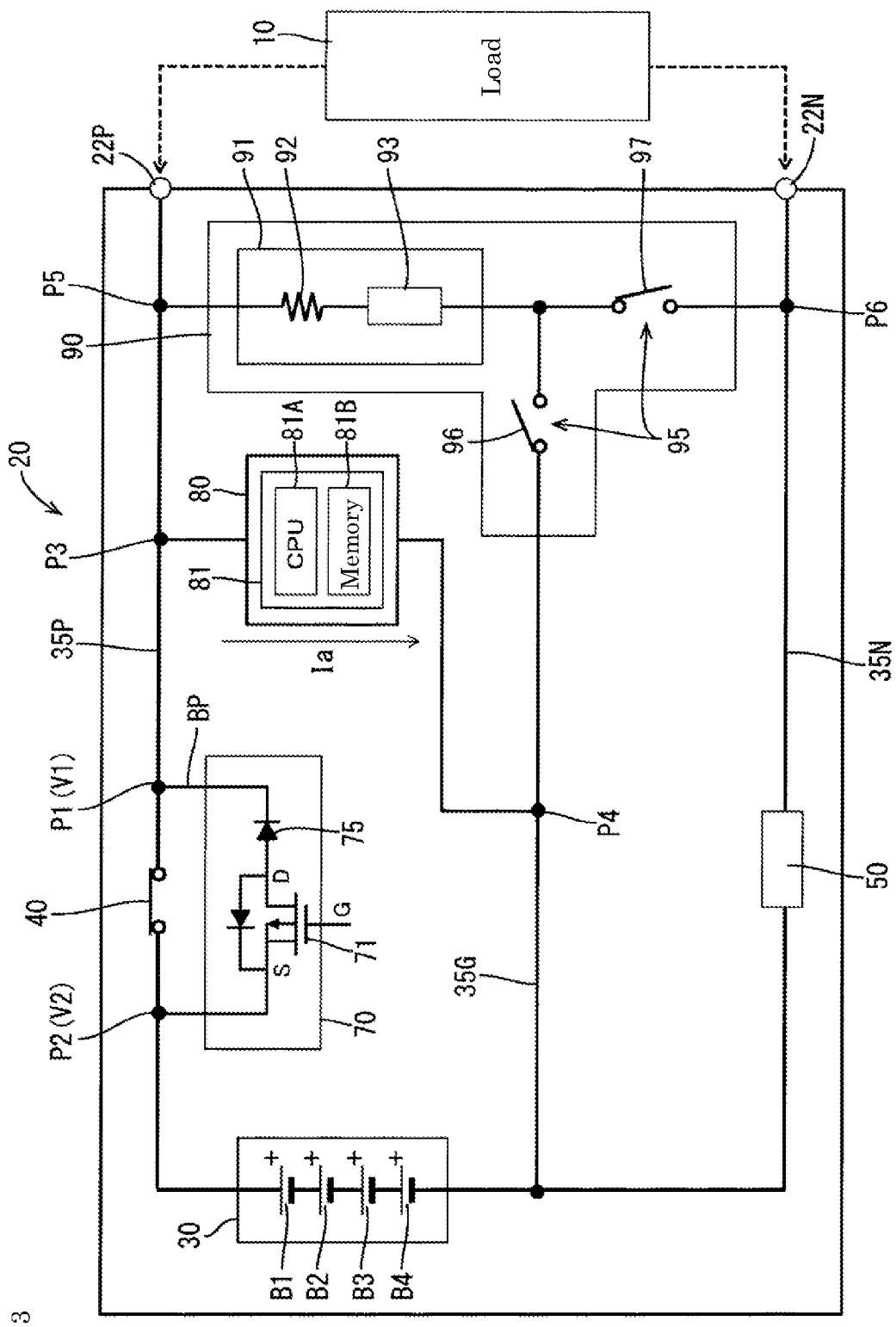
FIG. 3 is a block diagram illustrating an electric configuration of the battery.

With reference to FIG. 3, an electric configuration of the battery 20 will be described. The battery 20 is a 12-V system for a vehicle, and includes an assembled battery 30, a cutoff switch 40, a first current sensor 50, a parallel circuit 70, and a controller 80.

The assembled battery 30 includes the plurality of secondary battery cells B1 to B4 connected in series. The secondary battery cells B1 to B4 may be a lithium ion secondary battery cell. The secondary battery cells B1 to B4 are an example of the "energy storage device" of the present invention.

The assembled battery 30, the cutoff switch 40, and the current sensor 50 are connected in series through power lines 35P, 35N. The power line 35P connects the external terminal 22P of the positive electrode and the positive electrode of the assembled battery 30. The power line 35N connects the external terminal 22N of the negative electrode and the negative electrode of the assembled battery 30. The battery 20 includes a ground line 35G in addition to the two power lines 35P, 35N. The ground line 35G is connected to the negative electrode of the assembled battery 30.

The cutoff switch 40 is located at the positive electrode of the assembled battery 30, and provided in the power line 35P of the positive electrode. The cutoff switch 40 is a switch that cuts off the current of the assembled battery 30, and can be constituted of a relay, an FET, or the like.

The cutoff switch 40 is disposed on the circuit board 28 and accommodated in the battery case 21. The cutoff switch 40 is normally closed.

The parallel circuit 70 is located on a bypass path BP of the cutoff switch 40 and connected in parallel with the cutoff switch 40. The parallel circuit 70 includes a parallel switch 71 and a diode 75. The parallel switch 71 and the diode 75 are connected in series. The parallel circuit 70 is provided on the circuit board 28.

The parallel switch 71 is a P-channel field effect transistor, and has a source connected to the positive electrode of the assembled battery 30 and a drain connected to an anode of the diode 75.

In the diode 75, a discharge direction of the assembled battery 30 is a forward direction, the anode is connected to the drain of the parallel switch 71, and a cathode is connected to the external terminal 22P of the positive electrode. The diode 75 is a rectifier element in which the discharge direction is the forward direction.

Figure 4:
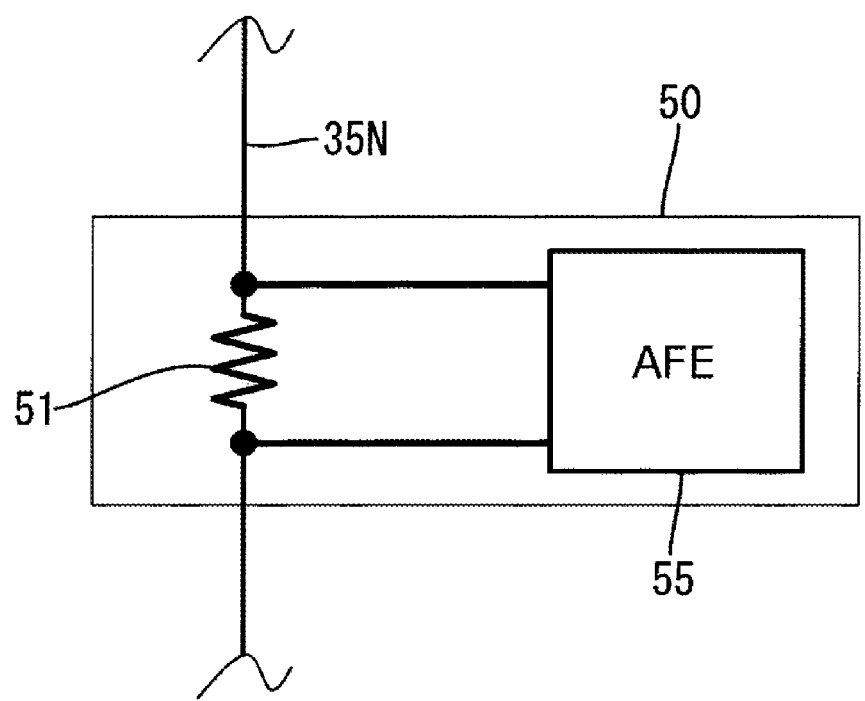
FIG. 4 is a circuit diagram of a first current sensor.

The first current sensor 50 is located near the negative electrode of the assembled battery 30 and provided in the power line 35N of the negative electrode. As illustrated in FIG. 4, the first current sensor 50 includes a current detection resistor 51 and an analog front end (AFE) 55. The first current sensor 50 measures a current I of the assembled battery 30 based on the voltage across the current detection resistor 51.

The controller 80 includes a plurality of ICs (in the drawing, only the control IC is illustrated and the other ICs are omitted) such as a control IC 81 and a power supply IC, and is disposed on the circuit board 28. The control IC 81 includes a central processing unit (CPU) 81A having an arithmetic function and a memory 81B. The controller 80 is connected to a connection point P3 on the power line 35P of the positive electrode, and receives power supply from the assembled battery 30. The controller 80 is connected to a connection point P4 on the ground line 35G, and a consumption current Ia of the controller 80 flows in a path from the power line 35P of the positive electrode to the ground line 35G. The controller 80 is an internal circuit in which the power is supplied from the battery 20.

The controller 80 sends a command to the cutoff switch 40 or the parallel switch 71 to control on and off of the cutoff switch 40 and the parallel switch 71. "On" means closed (closed circuit), and "off" means open (open circuit).

The battery 20 supplies the power to the load 10 connected to the positive and negative external terminals 22P, 22N. The controller 80 monitors the state of the battery 20 for predetermined monitoring items such as voltage, current, and temperature.

When there is an abnormality in the battery 20, the controller 80 performs a protection operation of protecting the battery 20 by opening the cutoff switch 40 to cut off the current I. The battery 20 can continue discharge to the load 10 through the parallel circuit 70 even when the cutoff switch 40 is open. That is, by controlling the parallel switch 71 to be closed while the cutoff switch 40 is open, the discharge to the load 10 can be continued through the parallel circuit 70.

The controller 80 performs processing for detecting the current I of the secondary battery cells B1 to B4 based on output of the first current sensor 50 and processing for estimating a state of charge (SOC) of the secondary battery cells B1 to B4 based on the detected current I.

The SOC is a ratio of a residual capacity to a full charge capacity, and is expressed by the following Equation (1). The SOC can be estimated based on an integral value of the current I with respect to time as expressed by the following Equation (2). A sign of the current is set to positive during charge, and set to negative during discharge.

$$SOC=(Cr/Co)\times 100 \quad (1)$$

Where Co is the full charge capacity of the secondary battery, and Cr is the remaining capacity of the secondary battery.

$$SOC=SOCo+100\times(\int Idt/Co) \quad (2)$$

Where SOCo is an initial value of SOC, and I is the current.

The memory 81B stores a program estimating the SOC and a program executing a measurement sequence of an offset error ε. The program can be transferred while stored in a recording medium such as a CD-ROM. The program can also be distributed using an electric communication line.

The battery 20 further includes a discharge circuit 90. The discharge circuit 90 is a circuit that discharges an inspection current Ib. The discharge circuit 90 includes a series circuit 91, a first changeover switch 96, and a second changeover switch 97.

The series circuit 91 includes a current limiting resistor 92 and a second current sensor 93. One end of the series circuit 91 is connected to a connection point P5 on the power line 35P of the positive electrode. The connection point P5 is located between the switch 40 and the external terminal 22P of the positive electrode.

The first changeover switch 96 connects the other end of the series circuit 91 onto the ground line 35G. The second changeover switch 97 connects the other end of the series circuit 91 to the connection point P4 on the power line 35N of the negative electrode. A connection point P6 is located between the current sensor 50 and the external terminal 22N of the negative electrode.

The first changeover switch 96 and the second changeover switch 97 are a switching circuit 95 that switches a current path of the inspection current Ib. The inspection current Ib can be discharged through a first discharge path L1 in FIG. 8 by opening the second changeover switch 97 and closing the first changeover switch 96.

Figure 9:
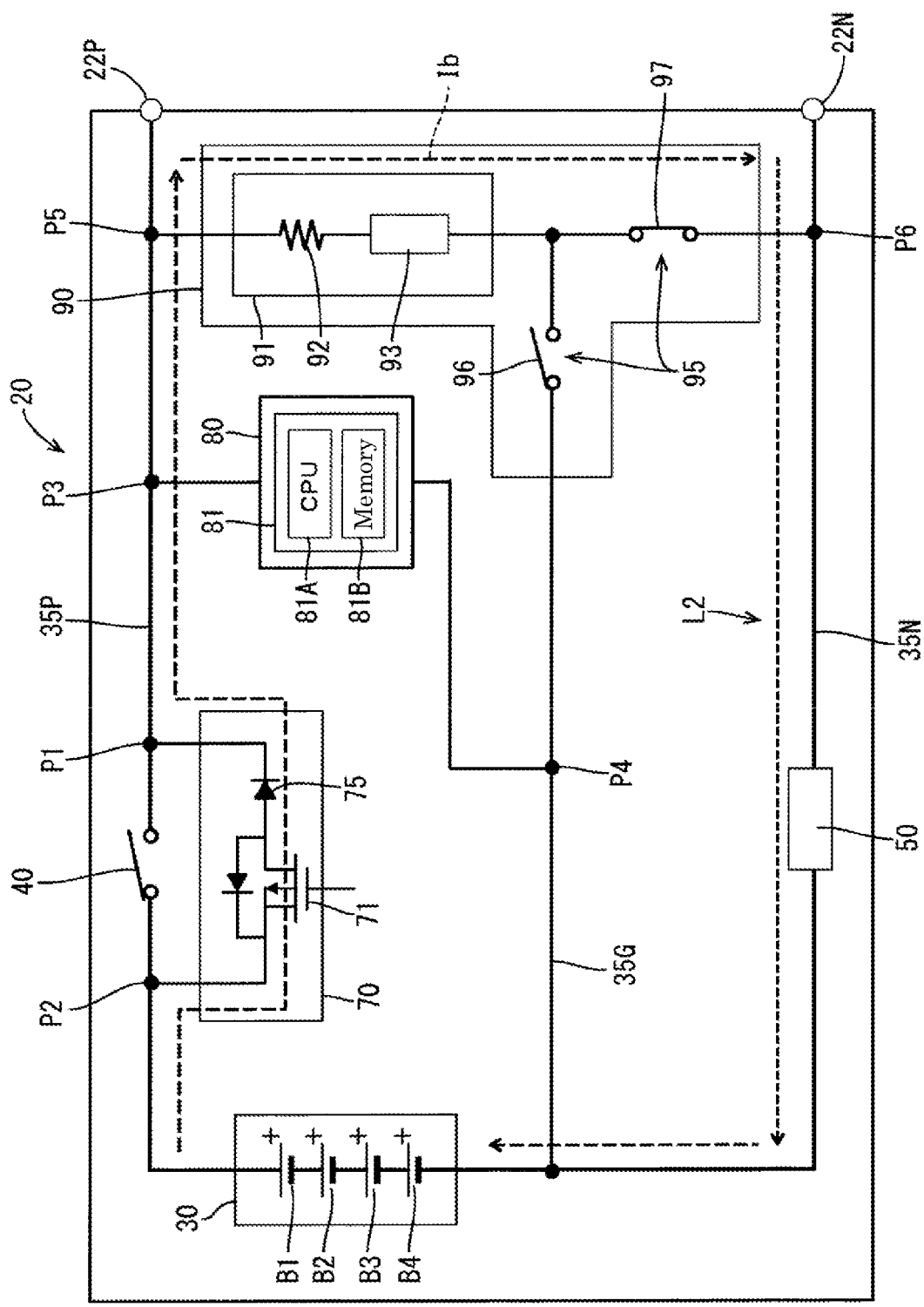
FIG. 9 is a view illustrating a second discharge path.

The inspection current Ib can be discharged through a second discharge path L2 in FIG. 9 by opening the first changeover switch 96 and closing the second changeover switch 97. The two changeover switches 96, 97 are controlled to be open except for a part of a period in the measurement sequence of the offset error.

Figure 5:
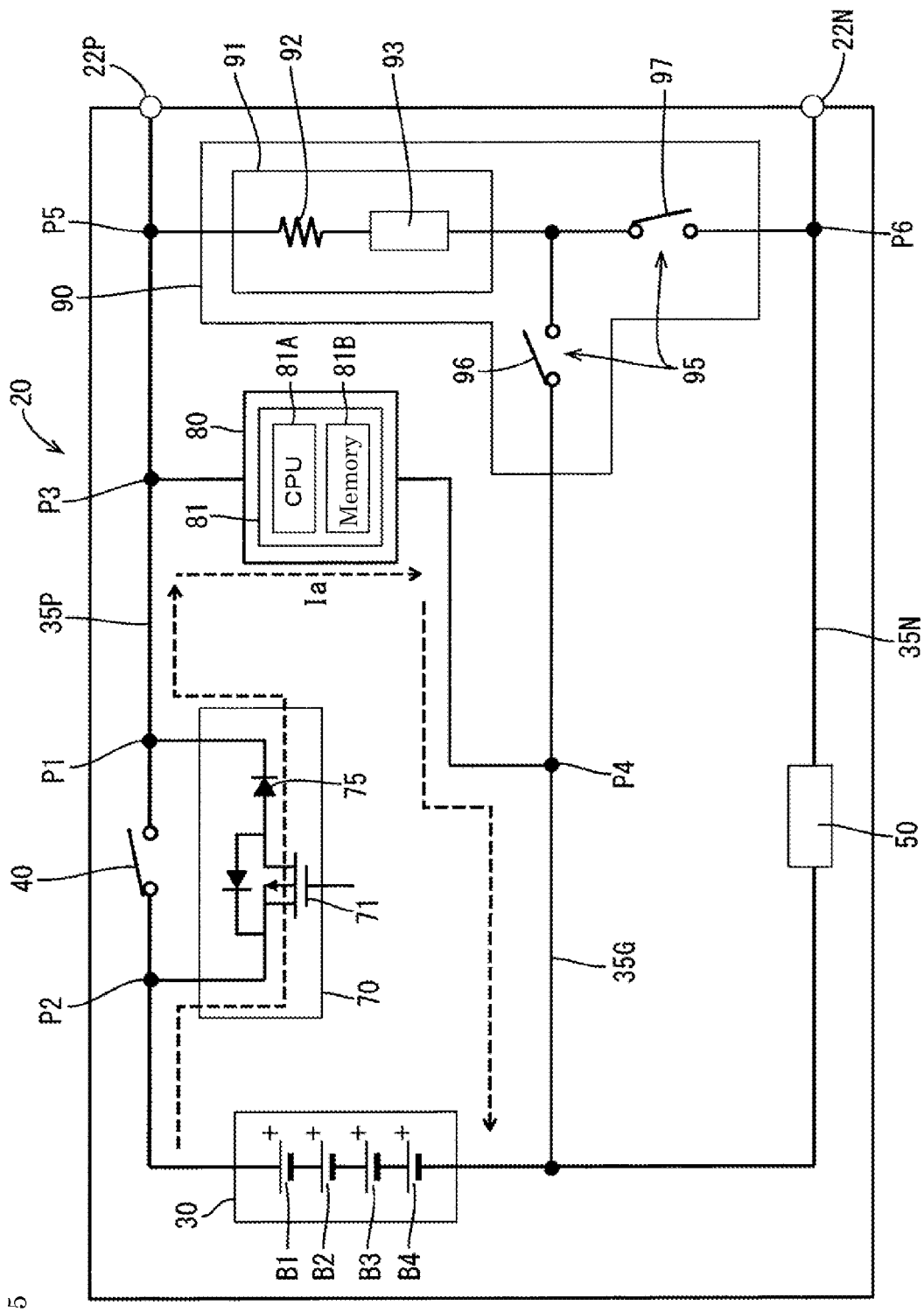
FIG. 5 is a view illustrating an internal discharge path of the battery.

Regarding the positional relationship between the connection point P3 of the controller 80 and the connection point P5 of the series circuit 90 with respect to the power line 35P of the positive electrode, the connection point P5 is located on the outer side closer to the external terminal 22P of the positive electrode than the connection point P3 as viewed from the assembled battery 30. For this reason, as illustrated in FIG. 5, the series circuit 90 is located outside the current path of the consumption current Ia of the controller 80.

The current limiting resistor 92 is a predetermined high resistor and is provided to limit the inspection current Ib to a constant current of about several tens of mA. The second current sensor 93 is used for measuring the inspection current Ib.

2. Measurement of Offset Error ε

Even when the true value is zero, the first current sensor 50 has an offset error E indicating a numerical value other than zero. The offset error ε can be measured by detecting a measurement value (an output value of the AFE 55) of the first current sensor 50 while the first current sensor 50 is in a non-current state.

Figure 6:
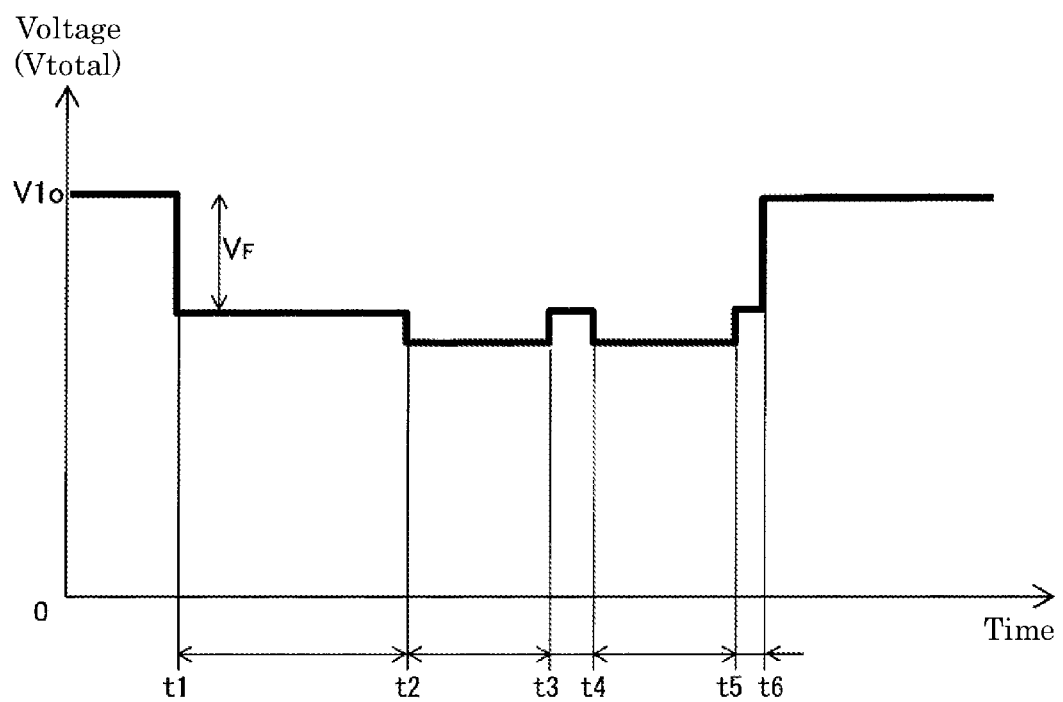
FIG. 6 is a view illustrating a voltage waveform at a point P1 in a measurement sequence.

An outline of a measurement sequence of the offset error ε will be described. FIG. 6 illustrates a voltage waveform V1 at a point P1 in the measurement sequence.

The offset error ε is measured by opening the cutoff switch 40. The charge is prohibited by opening the cutoff switch 40. A time t1 in FIG. 6 is opening timing of the cutoff switch 40.

A period from t1 to t2 is a measurement period of the offset error ε. The reason why the voltage waveform V1 decreases from an initial value V1*o* during the period from t1 to t2 is that when the cutoff switch 40 is open, the power supply path for the controller 80 is switched from the cutoff switch 40 to the parallel circuit 70, so that the diode 75 is conducted to generate a voltage drop VF.

A period from t2 to t3 is a period in which the inspection current Ib is discharged through the first discharge path L1. The reason why the voltage waveform V1 decreases further during the period from t2 to t3 than during the period from time t1 to t2 is that the voltage drop is generated in the resistor due to the discharge of the inspection current Ib. A period from t3 to t4 is a period in which the discharge path is switched. A period from t4 to t5 is a period in which the inspection current Ib is discharged through the second discharge path L2.

The controller 80 checks the operation of the first current sensor 50 based on the measurement values of the first current sensor 50 in the period from t2 to t3 and the period from t4 to t5. That is, it is checked whether the first current sensor 50 correctly measures the current and whether the measurement value is reliable.

When determining that the first current sensor 50 "correctly measures the current", the controller 80 determines that the measurement value of the offset error ε is "valid". On the other hand, when determining that "the current is not correctly measured", the first current sensor 50 determines that the measurement value of the offset error ε is "invalid".

t6 in FIG. 6 indicates timing at which the cutoff switch 40 is returned from the open state to the closed state with the end of the measurement sequence.

Figure 7:
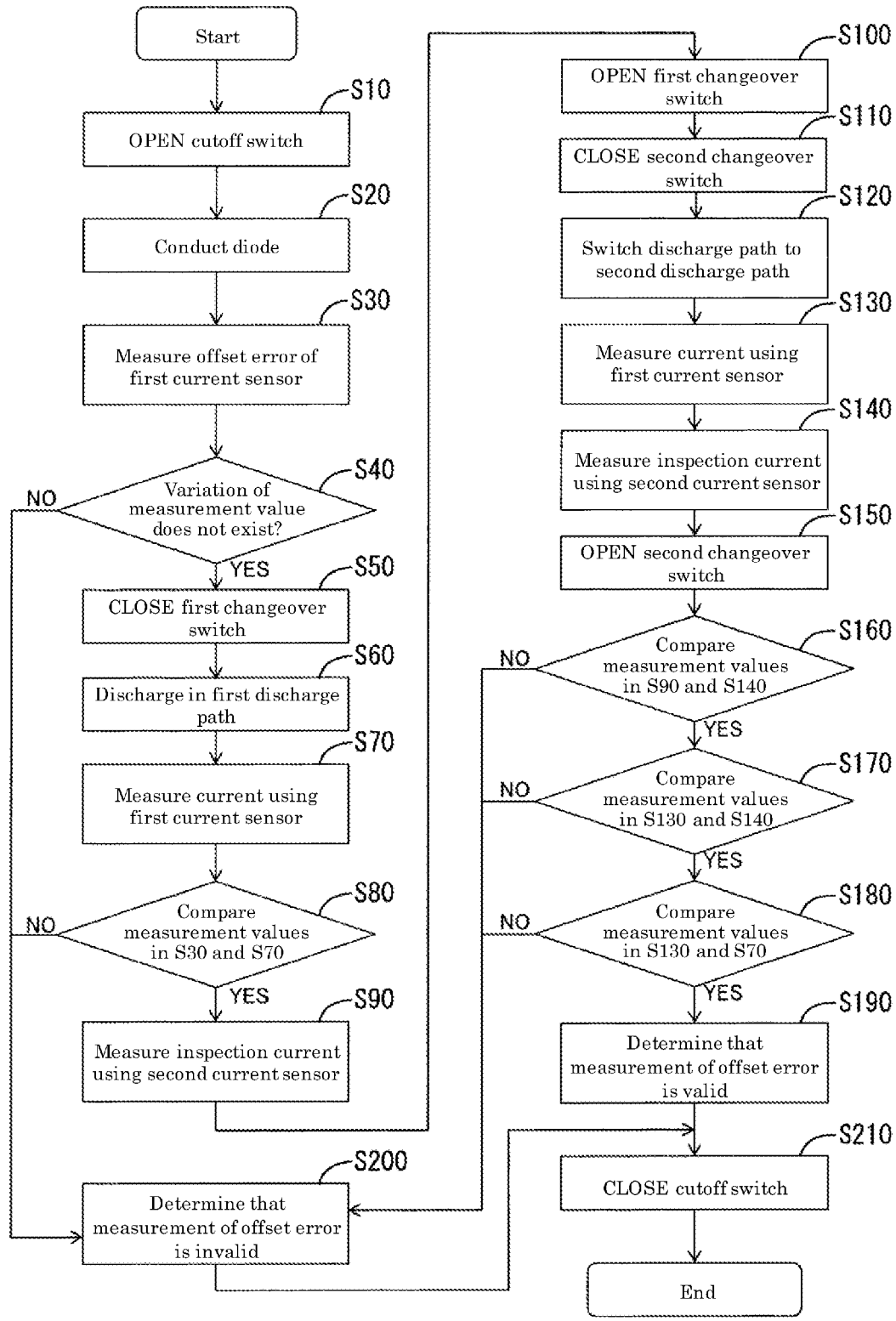
FIG. 7 is a view illustrating the measurement sequence of an offset error.

FIG. 7 illustrates the measurement sequence of the offset error ε. The measurement sequence includes twenty-one steps of S10 to S210.

Before execution of the measurement sequence, it is assumed that both of the two changeover switches 96, 97 of the discharge circuit 90 are controlled to be open by the controller 80.

When the measurement sequence starts, the controller 80 first switches the parallel switch 71 from the open state to the closed state in S10, and then switches the cutoff switch 40 from the closed state to the open state.

When the cutoff switch 40 is switched from the closed state to the open state in S10, the diode 75 of the parallel circuit 70 is conducted in S20. At this time, as illustrated in FIG. 5, when the load 10 is not connected to the battery 20, the assembled battery 30 is in the state of outputting only the consumption current Ia of the controller 80. When the load 10 is connected, the discharge current to the load 10 is output in addition to the consumption current Ia to the controller 80.

In S30, the controller 80 measures the measurement value (the output value of the AFE 55) of the first current sensor 50 as the offset error ε. The measurement of the measurement value is performed at least several times.

In step S40, the controller 80 determines whether the measurement value varies. That is, the plurality of measurement values measured in S30 are compared with each other to determine the presence or absence of the variation. When the variation is less than or equal to an allowable value, it is determined that there is no variation.

In the measurement sequence, four pieces of processing of S10 to S40 are pieces of processing executed in the period of t1 to t2 in FIG. 6.

When it is determined that there is no variation in the measurement value in S40, the controller 80 switches the first changeover switch 96 of the discharge circuit 90 from the open state to the closed state in S50.

Figure 8:
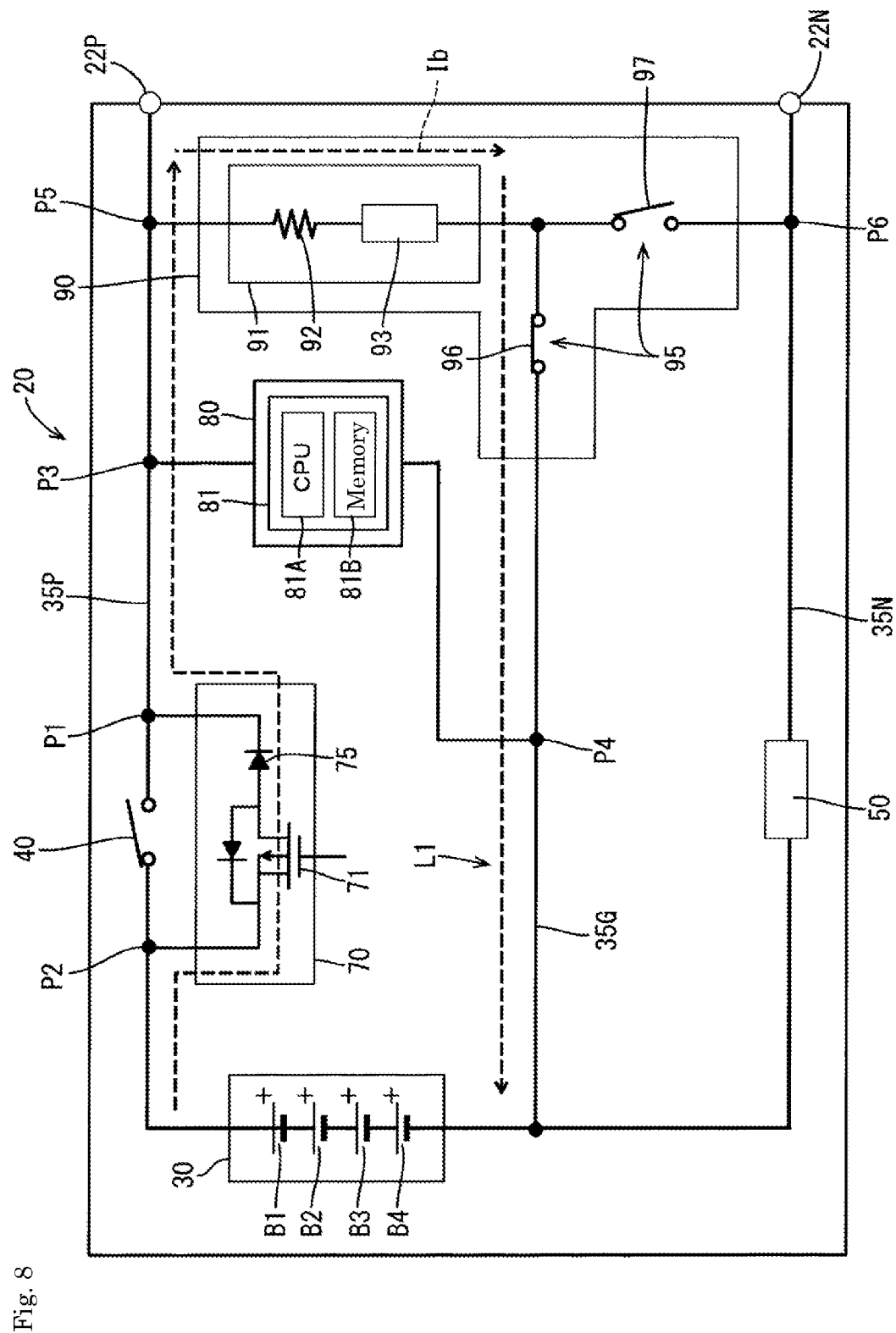
FIG. 8 is a view illustrating a first discharge path.

When the first changeover switch 96 is switched to the closed state, the discharge circuit 90 is conducted, and therefore the inspection current Ib flows in the first discharge path L1 in S60. As illustrated in FIG. 8, the first discharge path L1 is a path returning from the assembled battery 30 to the ground line 35G through the diode 75, the power line 35P of the positive electrode, and the discharge circuit 90. That is, the first discharge path L1 is a path through which the inspection current Ib does not flow in the first current sensor 50.

The controller 80 measures the current using the first current sensor 50 during the discharge through the first discharge path L1 in S70, and compares the two measurement values in S80. That is, the measurement value in S30 by the first current sensor 50 is compared with the measurement value in S70.

When the difference between the two measurement values is less than or equal to the allowable value, the controller 80 determines that the two measurement values are matched with each other. When the two measurement values are matched, it is determined that the inspection current Ib flows through the first discharge path L1 but does not flow through the first current sensor 50 (YES in S80).

When the two measurement values are matched with each other, the controller 80 causes the second current sensor 93 to measure the current value of the inspection current Ib in S90. In the measurement sequence, five pieces of processing of S50 to S90 are pieces of processing executed in the period of t2 to t3 in FIG. 6.

After measuring the inspection current Ib, the controller 80 switches the first changeover switch 96 from the closed state to the open state in S100, and switches the second changeover switch 97 from the open state to the closed state in S110. In the measurement sequence, two pieces of processing of S100 to S110 are pieces of processing executed in the period of t3 to t4 in FIG. 6.

By switching between the first changeover switch 96 and the second changeover switch 97, the current path of the inspection current Ib is switched from the first current path L1 to the second current path L2 in S120.

As illustrated in FIG. 9, the second current path L2 is a path returning from the assembled battery 30 to the power line 35N of the negative electrode through the diode 75, the power line 35P of the positive electrode, and the discharge circuit 90. That is, the second discharge path L2 is a path through which the inspection current Ib flows to the first current sensor 50.

The controller 80 measures the inspection current Ib using the first current sensor 50 during the discharge through the second discharge path L2 in S130, and measures the inspection current Ib using the second current sensor 93 in S140.

After measuring the inspection current Ib, the controller 80 switches the second changeover switch 97 from the closed state to the open state in S150. Thus, because the two changeover switches 96, 97 return to the open state, the discharge circuit 90 becomes non-conductive, and the inspection current Ib is cut off (t5 in FIG. 6).

In the measurement sequence, four pieces of processing of S120 to S150 are pieces of processing executed in the period of t4 to t5 in FIG. 6.

In S160, the controller 80 performs processing for comparing the measurement values in S90 and S140 by the second current sensor 93. S90 and S140 are pieces of processing for measuring the inspection current Ib using the second current sensor 93 before and after the switching of the discharge path. The inspection current Ib is constant regardless of the switching of the discharge path, and the measurement values of S90 and S140 by the second current sensor 93 should not change.

When the difference between the two measurement values is less than or equal to a first allowable value, the controller 80 determines that the inspection current Ib does not change (YES in S160). The first allowable value may be determined based on the measurement accuracy of the second current sensor 93. For example, when the allowable value of the measurement error of the second current sensor 93 is less than ±20 mA, the first allowable value may be less than ±20 mA.

When determining that the inspection current Ib does not change, in S170, the controller 80 compares the measurement value in S130 by the first current sensor 50 with the measurement value in S140 by the second current sensor 93 to determine whether the two measurement values are matched with each other. When the difference between the two measurement values is less than or equal to a second allowable value, it is determined that the two measurement values are matched with each other. The second allowable value may be determined based on the measurement accuracy of the first current sensor 50 and the second current sensor 93. For example, when the allowable values of the measurement errors of the first current sensor 50 and the second current sensor 93 are each less than ±20 mA, the second allowable value may be less than ±40 mA.

When it is determined in the determination processing of S170 that the two measurement values are matched with each other, it can be determined that the measurement value (measurement value of S130) of the inspection current Ib by the first current sensor 50 is matched with the inspection current Ib (measurement value of S140) by the second current sensor 93.

Furthermore, in S180, the controller 80 compares the measurement value in S130 by the first current sensor 50 with the measurement value in S70 by the first current sensor 50, and obtains a difference ΔI that is a difference between magnitudes of the two measurement values. Then, it is determined whether the difference ΔI is matched with the current value of the inspection current Ib. When the difference between the difference ΔI and the inspection current Ib is less than or equal to a third allowable volume value, it is determined that the difference ΔI and the inspection current Ib are matched with each other. The third allowable value may be determined based on the measurement accuracy of the first current sensor 50. For example, when the allowable value of the measurement error of the first current sensor 50 is less than ±20 mA, the third allowable value may be less than ±20 mA.

When it is determined in the determination processing of S180 that the difference ΔI is matched with the inspection current Ib, it can be determined that the measurement value (S70, S130) of the first current sensor 50 is increased by the inspection current Ib by switching the path of the inspection current Ib from the first discharge path L1 in FIG. 8 to the second discharge path L2 in FIG. 9.

When determining that the two measurement values are matched with each other in S170 and when determining that the difference ΔI is matched with the inspection current Ib in S180, the controller 80 determines that the first current sensor 50 "correctly measures the current", and determines that the measurement of the offset error ε of the first current sensor 50 performed in S30 is "valid" (S190).

When determining that the measurement of the offset error ε is "valid" in S190, the controller 80 switches the cutoff switch 40 from the open state to the closed state in S210 (time t6 in FIG. 6). Furthermore, after the cutoff switch 40 is switched to the close state, the parallel switch 71 is switched from the closed state to the open state.

Thus, the battery 20 returns to the state before executing the measurement sequence, and the measurement sequence of the offset error ε ends.

When NO is determined in any of steps S170 to S180, the controller 80 proceeds to S200, determines that the first current sensor 50 "does not correctly measure the current", and determines that the measurement value (S30) of the offset error ε is "invalid". Even when NO is determined in any of steps S40, S80, S160, a failure of the discharge circuit 90 or the like is considered, and thus, similarly the measurement value of the offset error ε is determined to be "invalid".

When determining that the measurement value of the offset error ε is "invalid" in S200, the controller 80 switches the cutoff switch 40 from the open state to the closed state in S210. Furthermore, after the cutoff switch 40 is switched to the close state, the parallel switch 71 is switched from the closed state to the open state. Thus, the measurement sequence ends.

In the measurement sequence, the four pieces of processing of S160 to S200 may be performed at any time after the processing of S140 ends. For example, the determination may be performed in the period (t5 to t6 in FIG. 6) from the cutoff of the inspection current Ib to the closing of the cutoff switch 40, or performed after the cutoff switch 40 is closed (after t6 in FIG. 6).

When determining that the measurement value (S30) of the offset error ε is "valid" in the measurement sequence, the controller 80 performs correction processing for correcting the offset error ε of the first current sensor 50 during the measurement of the currents of the secondary battery cells B1 to B4. The correction equation is expressed by the following Equation (4).

In this way, the current measurement accuracy can be improved, and the SOCs of the secondary battery cells B1 to B4 can be accurately estimated.

$$It = Io - \varepsilon \quad (4)$$

It is the measurement value after the correction, Io is the measurement value before the correction, and ε is the offset error. In Equation (4), the signs of the current and the offset error are set such that the charge direction is positive and the discharge direction is negative.

3. Relationship Between Measurement Sequence and Load

Because the offset error ε is the measurement value when the true value is zero, preferably the offset error ε is preferably measured during a current-free period of the battery 20.

When the battery 20 does not have a function of determining whether there is no current, the measurement sequence is executed regardless of whether the battery 20 has no current. The non-current state is a state in which neither the charge nor the discharge is performed or a state in which it can be considered that neither the charge nor the discharge is performed except for the current consumed inside the battery 20.

In the case where the battery 20 has no current during the execution of the measurement sequence, when the first current sensor 50 is normal, the inspection current Ib can be correctly measured, and the offset error ε is determined to be valid. That is, by executing the measurement sequence, the offset error ε can be measured using the no-current period, which is caused e.g. when no load is connected.

Preferably the measurement sequence is repeatedly executed every predetermined period such as every other week to update the offset error ε to the latest value. In this way, even when the offset errors changes due to a temperature change or the like, the influence can be reduced.

In the case where the load 10 is connected to the battery 20 during the execution of the measurement sequence, NO is determined in any of S40, S170, S180, and as a result, the first current sensor 50 is determined to be "incorrect". This is because the first current sensor 50 measures the load current in addition to the inspection current. From the above, the measurement value of the offset error ε is determined to be invalid, and the data is not used for the correction.

FIG. 10 is a table illustrating the determination result (S170, S180) of the validity of the offset error ε. In this example, the inspection current Ib is 50 mA, and the allowable value of the measurement error of the first current sensor 50 and the second current sensor 93 is less than ±20 mA.

For the first current sensor 50 and the second current sensor 93, when the measurement error with respect to the true value is less than ±20 mA (second stage, third stage), it is determined that the offset errors is valid. For the first current sensor 50 and the second current sensor 93, when the measurement error with respect to the true value deviates from ±20 mA (fourth stage, fifth stage), it is determined that the offset error ε is invalid.

4. Description of Effect

For example, it is generally conceivable that the operation of the first current sensor 50 is checked in the state where the cutoff switch 40 is open to cut off the current from the outside during the non-current period of the battery 20. The battery 20 including the parallel circuit 70 can be discharged through the parallel circuit 70 even when the cutoff switch 40 is opened. In this configuration, the inspection current Ib flows through the first current sensor 50 using the discharge circuit 90 while the cutoff switch 40 is open, and the value of inspection current Ib is measured, and therefore the operation of first current sensor 50 can be checked. That is, whether the first current sensor 50 correctly measures the current can be determined based on the measurement value of the inspection current Ib by the first current sensor 50.

By adopting the present technology, the offset error ε can be measured and the validity thereof can be determined using the no-current period which is caused when e.g. no load is connected. Thus, the current can be measured with high accuracy by correcting the offset error at during the current measurement after the load connection.

Other Embodiments

The present invention is not limited to the embodiment described with reference to the above description and the drawings. For example, the following embodiments are also included in the technical scope of the present invention.

(1) In the first embodiment, the secondary battery cell is illustrated as an example of the energy storage device. The energy storage device may be a capacitor or the like. The energy storage device is not limited to the plurality of cells, but may be a single cell.

(2) In the first embodiment, the battery 20 is used for the vehicle. The battery 20 can be used not only for vehicles but also for various applications such as aircrafts, ships, and railways. In particular, the load that does not allow power cutoff is preferable, but it may be for the load that partially allows the power cutoff.

(3) In the first embodiment, the cutoff switch 40 is disposed in the power line 35P of the positive electrode, and the first current sensor 50 is disposed in the power line 35N of the negative electrode. The configuration may be reversed, and the cutoff switch 40 may be disposed in the power line 35N of the negative electrode while the first current sensor 50 is disposed in the power line 35P of the positive electrode. The cutoff switch 40 and the first current sensor 50 may be disposed on the same power lines 35P, 35N. For example, both the cutoff switch 40 and the first current sensor 50 may be disposed in the power line 35P of the positive electrode, or both may be disposed in the power line 35N of the negative electrode.

(4) The first embodiment illustrates the diode 75 as an example of the rectifier element. The rectifier element may be a diode-connected FET. The diode connection is a connection that short-circuits the gate and the source.

(5) In the first embodiment, the determinations of S170 and S180 are made, and in the case where YES is determined in both S170 and S180, it is determined that the measurement value of the first current sensor 50 is "correct". Alternatively, only S170 may be performed among the two determinations of S170 and S180 to determine whether the measurement value is good or bad. That is, when the first discharge path L1 is selected to cause the inspection current Ib to flow, and when the measurement value is matched with the inspection current Ib, it may be determined that the measurement value of first current sensor 50 is "correct". When only S170 is executed and S180 is not executed, the discharge circuit 90 may be constituted of the current limiting resistor 92, the second current sensor 93, and the second changeover switch 97, and the first changeover switch 96 may be eliminated. Furthermore, the second current sensor 93 may be eliminated. When the second current sensor 93 is eliminated, a theoretical value (a numerical value determined by the voltage of the assembled battery 30 and the current limiting resistor 92) may be used as the inspection current Ib.

In the two determinations of S170 and S180, only S180 may be executed to determine the quality of the measurement value of the first current sensor 50. That is, when the difference ΔI between the measurement value of the first current sensor 50 in the case where the second discharge path L2 is selected as the discharge path of the inspection current Ib and the measurement value of the first current sensor 50 in the case where the first discharge path L1 is selected is matched with the inspection current Ib, it may be determined that the measurement value of the first current sensor 50 is "correct".

(6) In the first embodiment, the correction processing of correcting the measurement value of the first current sensor 50 is executed based on the offset error ε. Alternatively, the SOC may be corrected without correcting the measurement value. Specifically, when the SOC is obtained by current integration, an error of the SOC (an error of the SOC caused by the offset error of the current sensor 50) may be corrected based on a current integration time and the offset error ε.

The invention claimed is:

1. An energy storage apparatus comprising:
an energy storage device;
a cutoff switch that cuts off current of the energy storage device;
a parallel circuit including a rectifier element in which a discharge direction is set to a forward direction, the parallel circuit being connected in parallel to the cutoff switch;
a first current sensor that measures the current of the energy storage device;
a discharge circuit that discharges an inspection current to the first current sensor through a discharge path including the parallel circuit using the energy storage device as a power source; and
a controller,
wherein:
the controller determines whether the first current sensor correctly measures the current based on a measurement value of the inspection current, and
the discharge circuit includes a switching circuit disposed within the energy storage apparatus,
the switching circuit switches a current path of the inspection current between a first discharge path that does not pass through the first current sensor and a second discharge path that passes through the first current sensor.

2. The energy storage apparatus according to claim 1, wherein the discharge circuit includes a second current sensor that measures the inspection current.

3. The energy storage apparatus according to claim 1, wherein
the controller measures an offset error of the first current sensor, and
the controller determines that a measurement value of the offset error is valid when determining that the first current sensor correctly measures the current from the measurement value of the inspection current.

4. The energy storage apparatus according to claim 3, wherein the controller performs correction processing for correcting the offset error of the first current sensor when determining that the measurement value of the offset error is valid.

5. A method for checking a function of an energy storage apparatus,
the energy storage apparatus including:
an energy storage device;
a cutoff switch that cuts off current of the energy storage device;
a parallel circuit including a rectifier element in which a discharge direction is set to a forward direction, the parallel circuit being connected in parallel to the cutoff switch;
a first current sensor that measures the current of the energy storage device; and
a discharge circuit that discharges an inspection current to the first current sensor through a discharge path including the parallel circuit using the energy storage device as a power source, wherein the discharge circuit includes a switching circuit within the energy storage apparatus that switches a current path of the inspection current between a first discharge path that does not pass through the first current sensor and a second discharge path that passes through the first current sensor, the method comprising:
causing the switching circuit to switch the current path to the second discharge path;
after switching of the current path, discharging an inspection current to the first current sensor using the discharge circuit; and
determining whether the first current sensor correctly measures the current based on a measurement value of the inspection current of the first current sensor.

6. An energy storage apparatus comprising:
an energy storage device;
a cutoff switch that cuts off current of the energy storage device;
a parallel circuit including a rectifier element in which a discharge direction is set to a forward direction, the parallel circuit being connected in parallel to the cutoff switch;
a first current sensor that measures the current of the energy storage device;
a discharge circuit that discharges an inspection current to the first current sensor through a discharge path including the parallel circuit using the energy storage device as a power source; and
a controller,
wherein:
the controller determines whether the first current sensor correctly measures the current based on a measurement value of the inspection current,
the discharge circuit includes a switching circuit that switches a current path of the inspection current between a first discharge path that does not pass through the first current sensor and a second discharge path that passes through the first current sensor, and
the controller selects the second discharge path to cause the inspection current to flow and determines that the first current sensor correctly measures the current when a measurement value of the first current sensor is matched with the inspection current.

7. The energy storage apparatus according to claim 6, wherein the discharge circuit includes a second current sensor that measures the inspection current.

8. The energy storage apparatus according to claim 6, wherein the controller measures an offset error of the first current sensor, and
the controller determines that a measurement value of the offset error is valid when
determining that the first current sensor correctly measures the current from the measurement value of the inspection current.

9. The energy storage apparatus according to claim 8, wherein the controller performs correction processing for correcting the offset error of the first current sensor when determining that the measurement value of the offset error is valid.

10. An energy storage apparatus comprising:
an energy storage device;
a cutoff switch that cuts off current of the energy storage device;
a parallel circuit including a rectifier element in which a discharge direction is set to a forward direction, the parallel circuit being connected in parallel to the cutoff switch;
a first current sensor that measures the current of the energy storage device;

a discharge circuit that discharges an inspection current to the first current sensor through a discharge path including the parallel circuit using the energy storage device as a power source; and a controller, wherein:

the controller determines whether the first current sensor correctly measures the current based on a measurement value of the inspection current, the discharge circuit includes a switching circuit that switches a current path of the inspection current between a first discharge path that does not pass through the first current sensor and a second discharge path that passes through the first current sensor, and the controller determines that the first current sensor correctly measures the current when a difference between a measurement value of the first current sensor when the second discharge path is selected as the current path of the inspection current and a measurement value of the first current sensor when the first discharge path is selected is matched with the inspection current.

11. The energy storage apparatus according to claim 10, wherein the discharge circuit includes a second current sensor that measures the inspection current.

12. The energy storage apparatus according to claim 10, wherein the controller measures an offset error of the first current sensor, and the controller determines that a measurement value of the offset error is valid when determining that the first current sensor correctly measures the current from the measurement value of the inspection current.

13. The energy storage apparatus according to claim 12, wherein the controller performs correction processing for correcting the offset error of the first current sensor when determining that the measurement value of the offset error is valid.

14. An energy storage apparatus comprising:

an energy storage device;

a cutoff switch that cuts off current of the energy storage device;

a parallel circuit including a rectifier element in which a discharge direction is set to a forward direction, the parallel circuit being connected in parallel to the cutoff switch;

a first current sensor that measures the current of the energy storage device;

a discharge circuit that discharges an inspection current to the first current sensor through a discharge path including the parallel circuit using the energy storage device as a power source; and a controller, wherein:

the controller determines whether the first current sensor correctly measures the current based on a measurement value of the inspection current, the discharge circuit includes a switching circuit that switches a current path of the inspection current between a first discharge path that does not pass through the first current sensor and a second discharge path that passes through the first current sensor, and the controller determines that the first current sensor correctly measures the current when a measurement value of the first current sensor is matched with the inspection current when the second discharge path is selected to cause the inspection current to flow, and when a difference between a measurement value of the first current sensor when the second discharge path is selected as the current path of the inspection current and a measurement value of the first current sensor when the first discharge path is selected is matched with the inspection current.

15. The energy storage apparatus according to claim 14, wherein the discharge circuit includes a second current sensor that measures the inspection current.

16. The energy storage apparatus according to claim 14, wherein the controller measures an offset error of the first current sensor, and the controller determines that a measurement value of the offset error is valid when determining that the first current sensor correctly measures the current from the measurement value of the inspection current.

17. The energy storage apparatus according to claim 16, wherein the controller performs correction processing for correcting the offset error of the first current sensor when determining that the measurement value of the offset error is valid.

* * * * *